United States Patent
Dolan et al.

(10) Patent No.: US 10,263,565 B2
(45) Date of Patent: Apr. 16, 2019

(54) NON-LINEAR TRANSMISSION LINE DEVICE

(71) Applicant: BAE SYSTEMS plc, London (GB)

(72) Inventors: John Eric Dolan, Bristol, South Gloucestershire (GB); Matthew James Jenkins, Bristol, South Gloucestershire (GB)

(73) Assignee: BAE SYSTEMS plc, London (GB)

( * ) Notice: Subject to any disclaimer, the term of this patent is extended or adjusted under 35 U.S.C. 154(b) by 208 days.

(21) Appl. No.: 14/392,344

(22) PCT Filed: Jun. 25, 2014

(86) PCT No.: PCT/GB2014/051931
§ 371 (c)(1),
(2) Date: Dec. 24, 2015

(87) PCT Pub. No.: WO2014/207453
PCT Pub. Date: Dec. 31, 2014

(65) Prior Publication Data
US 2016/0204739 A1 Jul. 14, 2016

(30) Foreign Application Priority Data

Jun. 25, 2013 (EP) ..................................... 13250075
Jun. 25, 2013 (GB) .................................. 1311279.2

(51) Int. Cl.
*H03B 5/18* (2006.01)
*H01Q 13/10* (2006.01)
(Continued)

(52) U.S. Cl.
CPC ............ *H03B 5/1805* (2013.01); *H01P 11/00* (2013.01); *H01Q 13/10* (2013.01); *H03B 19/00* (2013.01); *H01P 3/06* (2013.01)

(58) Field of Classification Search
CPC ...... H03B 19/00; H03B 5/1805; H01Q 13/10; H01P 11/00
USPC ........ 331/107 SL, 154, 96, 101; 333/1.1, 20, 333/24.2, 204, 81 R; 343/770; 439/578; 332/173, 163
See application file for complete search history.

(56) References Cited

U.S. PATENT DOCUMENTS 2,897,452 A 7/1959 Southworth
2,963,668 A 12/1960 Ohm
(Continued)

FOREIGN PATENT DOCUMENTS

DE 1541681 A1 4/1970
GB 674874 7/1952
(Continued)

OTHER PUBLICATIONS

Bull. Mater. Sci., vol. 32, No. 5, Oct. 2008 pp. 767-770.*
(Continued)

*Primary Examiner* — Arnold Kinkead
(74) *Attorney, Agent, or Firm* — Finch & Maloney PLLC

(57) ABSTRACT

A non-linear transmission line device includes a magnetic element having at least one end profiled to reduce demagnetization when the element is biased. The profile may be tapered, stepped, or smoothly curved. Also disclosed is a non-linear transmission device made up of a solid magnetic element, typically of flat rectangular form.

21 Claims, 5 Drawing Sheets

Plain End

Tapered End

(51) Int. Cl.
  *H01P 11/00* (2006.01)
  *H03B 19/00* (2006.01)
  *H01P 3/06* (2006.01)

(56) References Cited

U.S. PATENT DOCUMENTS

| | | | |
|---|---|---|---|
| 3,072,869 A * | 1/1963 | Seidel | H01P 1/23 |
| | | | 332/163 |
| 3,082,384 A | 3/1963 | Crane et al. | |
| 3,748,605 A | 7/1973 | Baynham et al. | |
| 4,689,584 A * | 8/1987 | Sequeira | H01P 1/10 |
| | | | 333/1.1 |
| 7,450,059 B1 | 11/2008 | Seddon | |
| 7,498,978 B2 | 3/2009 | Seddon et al. | |
| 7,724,098 B2 | 5/2010 | Scott et al. | |
| 7,734,271 B2 * | 6/2010 | Pepper | G01R 1/24 |
| | | | 333/20 |

FOREIGN PATENT DOCUMENTS

| | | |
|---|---|---|
| GB | 2502096 A | 11/2013 |
| WO | 2014207453 A1 | 12/2014 |

OTHER PUBLICATIONS

International Search Report and Written Opinion received for Patent Application No. PCT/GB2014/051931, dated Oct. 17, 2014, 12 pages.
GB Intellectual Property Office Search Report under Section 17(5) received for GB Patent Application No. 1311279.2 dated Dec. 23, 2013. 5 pages.
Extended European Search Report received for EP Patent Application No. 13250075.2 dated Oct. 29, 2013.
International Preliminary Report on Patentability received for Patent Application No. PCT/GB2014/051931, dated Jan. 7, 2016, 9 pages.

\* cited by examiner

Plain End

Tapered End

Stepped End

Multiple Tapers Ended

Multiple Tapers with Inside Taper

Full Ellipsoid Like Curve

NON-LINEAR TRANSMISSION LINE DEVICE

This invention relates to non-linear transmission line (NLTL) devices and to components for use therein. In particular but not exclusively, the invention relates to such devices and components that utilise gyromagnetic precession.

It is known to use the gyromagnetic properties of ferrites as the basis for obtaining microwave pulses in many fields pertaining for example to high power microwave (HPM) signals, generation of HPM, radio frequency, permanent magnets, directed energy, impulse radar, microwave ferrites, nonlinear transmission lines (NLTL), ferromagnetic nonlinear transmission lines, microwave frequency oscillators, and gyromagnetic precession oscillators. Early work used spherical samples of YIG (Yttrium Iron Garnet) which were pulsed by a separate pulse circuit as described in Microwave Generation in Pulsed Ferrites, H. J. Shaw, B. J. Elliott, K. J. Harker, and A. Karp, J. Appl. Phys. 37, 1060-1066 (1966). This was limited in power by the combination of the power density which can be handled by the ferrite with the volume of the YIG spheres which was typically 1-5 mm$^3$.

More recent work has described the use of distributed NLTL devices in which the ferrite typically takes the form of one or more hollow cylindrical elements in either a continuous or periodic coaxial structure which provides for a travelling wave interaction with an extended working volume of material. Devices of this type have been described in U.S. Pat. No. 7,450,059, U.S. Pat. No. 7,498,978, and U.S. Pat. No. 7,724,098, the contents of which are incorporated herein by reference.

One benefit of the extended cylindrical approach in the MFO or 'gyromagnetic NLTL' is the much higher energy conversion volume, which enables higher power and overall radio frequency (RF) pulse energy to be developed than is possible with a device based on a spherical gyromagnetic core.

The theory and understanding of RF formation applies to the regions within the MFO/gyromagnetic NLTL magnetic core in which the uniform static magnetisation exists. It is crucial that the RF generated within the MFO/NLTL is able to propagate through the end region and exit into the linear constant impedance (e.g. 50 ohms) region without being reabsorbed.

Shock line and MFO devices with axial bias are generally formed from hollow cylinders of soft magnetic material (typically ferrite or garnet) preferably with gyromagnetic properties.

In typical devices the material is biased by a strong axial field (typically in the range 10-100 kA/m) in order to establish the preconditions for gyromagnetic precession behaviour. Ideally, the internal field and magnetisation should be axial and uniform throughout. However, it is well established that when a cylinder with plane ends is magnetised axially there is a reduction in magnetisation, i.e. a demagnetisation, of the region towards the end of the cylinder, which tends to oppose the desired state of uniform magnetisation.

In the case of a gyromagnetic NLTL/MFO device, (variously described in the literature as non-linear transmission line, microwave frequency oscillator, gyromagnetic precession oscillator), if the internal field within the magnetic material is reduced, the material becomes less strongly magnetised or even demagnetised. In this case the RF propagation characteristics become magnetically lossier.

If a length of more than a few mm at the end of the line is partially demagnetised, this is seen both in numerical simulation, and experimentally, to more or less fully attenuate the microwave waveform generated by the MFO, due to the increased losses. The effectiveness of the MFO device as a modulator is therefore diminished or even lost. If there is a plane end to the ferrite cylinder, the region extending backwards into the line by a distance approximately equal to the diameter becomes significantly demagnetised as shown in FIG. 1 of the accompanying drawings. From this it will be seen from the spreading of the flux lines that the density at the flat planar annular face of the cylinder is approximately halved. Because the axial extent of this effect is proportional to the diameter of the cylinder, if the ferrite diameter is greater than 2-3 mm, the demagnetisation region becomes long enough to give rise to significant losses. For all sizes of device, but particularly for larger MFOs with ferrite diameters, e.g. in the range ~5-50 mm, it is therefore important to reduce the extent of demagnetisation, and to maintain a more uniform magnetisation into the ends of the device.

It is known in the literature that a solid prolate ellipsoid eliminates demagnetisation towards the end and gives uniform axial magnetisation throughout but a solid prolate ellipsoid is not practical for the applications considered herein which require a hollow cylindrical or flat rectilinear basic shape.

We have therefore applied a numerical approach to find a shape which achieves uniform magnetisation throughout a cylinder, or at least substantially more uniform magnetisation than is obtained using the conventional plain ended hollow cylindrical elements. The general principle of a progressive taper in cross section towards the end of the magnetic core is applied.

Accordingly, in one aspect this invention provides a microwave frequency oscillator for producing a radio frequency (RF) signal, said microwave frequency oscillator comprising:

a non-linear transmission line containing at least one element of magnetic material, the magnetic element in use having a magnetic bias field along a given axis, an input for applying an input signal to the transmission line for being modulated thereby, and an output for the modulated signal, wherein said magnetic element has opposed end regions spaced along said axis, and at least one of said end regions is profiled to at least reduce demagnetisation of said material in said end region.

Suitable profiles include a progressive taper in cross section towards the end of the magnetic element, and may be determined numerically and/or empirically. For example successive approximations of varying ellipsoid-like cross sections may be used to achieve close to the ideal uniform magnetisation. An iterative numerical approach enables the profile to be selected to provide close to the required uniform magnetisation.

In some arrangements both said end regions are profiled to reduce demagnetisation in said end region.

In some arrangements the element may be of hollow cylindrical form, with at least one end region being internally or externally tapered, with the wall thickness of the cylinder decreasing towards the free end. A number of possible different profiles are possible and the choice may be determined by practical or cost considerations. For example the taper may be defined by a straight line generatrix defining a frusto-conical surface. In another arrangement said taper may be defined by a plurality of stepped regions, with the generatrix being stepped. Here the magnetic element may be monolithic or it may be made up of a plurality of concentric cylindrical sleeves of selected axial lengths. In yet another arrangement the taper may include two or more taper regions of different taper angle and merging to approximate a curve defined by the frusto-conical surfaces of different taper angle. It is also possible for the inner cylindrical wall to taper or flare outwardly. In this manner the axially facing cylindrical rim may have a polygonal or curved radial section, and the section may for example be ellipsoidal.

Many different architectures may be employed in the transmission line. For example the architecture may comprise a coaxial electrical conductor arrangement, with a first electrically conducting element passing through a hollow part of the magnetic element, and a concentric conductor element surrounding and spaced from said magnetic element, the coaxial conductor arrangement being adapted in use to receive an input pulse at one end from a pulse generator and to deliver an output signal at another end, with the end of the magnetic element proximate said output end being externally tapered. In some embodiments the end of the magnetic element proximate said input end may also be externally tapered, for example if the output is taken from the same end as the input.

Instead of being of hollow cylindrical construction, said magnetic element may be of solid form, or made up of a plurality of solid elements, for example in a periodic structure. In one example the magnetic element is of elongate generally rectilinear solid form, having first and second opposed end regions transverse to the longitudinal axis of the magnetic element, with said magnetic bias arrangement being configured to apply a bias field extending generally longitudinally, and the magnetic element tapering in thickness towards at least one of said end regions, thereby to provide a tapered longitudinal cross section. In this type of arrangement the magnetic element may also taper transversely. Thus with the height of the magnetic member being less than its width, the height of the magnetic element may reduce towards the sides thereby to provide the tapered transverse cross section. The terms "height" and "width" are used to distinguish which is the greater dimension (width) and do not imply any particular orientation.

Advantageously the taper provides a curved, preferably part ellipsoidal, profile section in the end regions.

The magnetic element may be made of any suitable ferromagnetic or ferrimagnetic material, including but not limited to one or more of the following:

Garnet-structured ferrite, e.g. yttrium iron garnet
Spinel type ferrite e.g. nickel zinc, lithium zinc
Micro or Nano-structured materials, e.g. Fe, Co, permalloy.

The invention also extends to a magnetic element for use in a non-linear transmission line device, said magnetic element being of elongate form and tapering in cross-section adjacent at least one end. The invention also extends to the use of the magnetic element as set out above in periodic non-linear transmission lines.

Although the embodiments using solid magnetic elements may have profiled sides or ends, the invention also extends to arrangements using solid elements with plain sides and ends.

In another aspect there is provided a microwave frequency oscillator producing an RF signal, said microwave frequency oscillator comprising a non linear transmission line including at least one magnetic element having x, y and z axes, a magnetic bias field in said magnetic element, in use, an input for applying an excitation pulse to propagate along said magnetic element in a direction parallel to or concentric with said axis, and an output for outputting a modulated output signal from said non linear transmission line, wherein said element of magnetic material comprises a solid element.

Whilst the invention has been described above it extends to any inventive combination or sub-combination of features described herein or disclosed in the following description or drawings.

The invention may be performed in various ways and, by example only, various specific embodiments thereof will be described in detail, reference being made to the accompanying drawings, in which.

Figure 5:
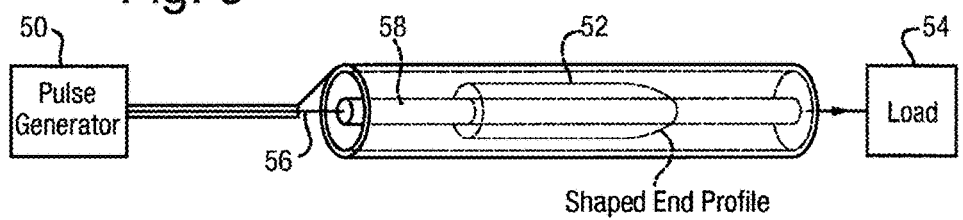
Figure 6:
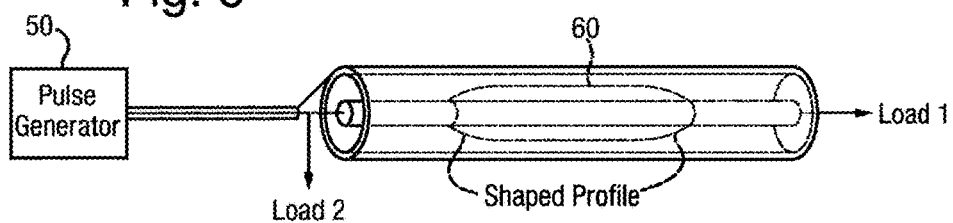
Figure 7:
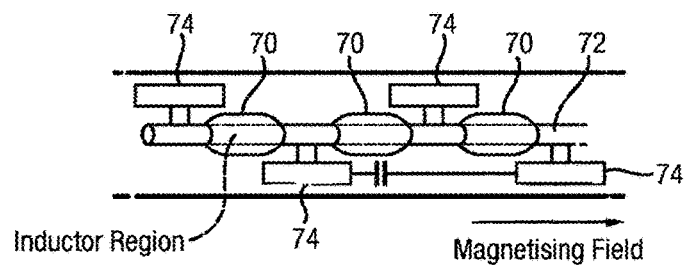
Figure 8:
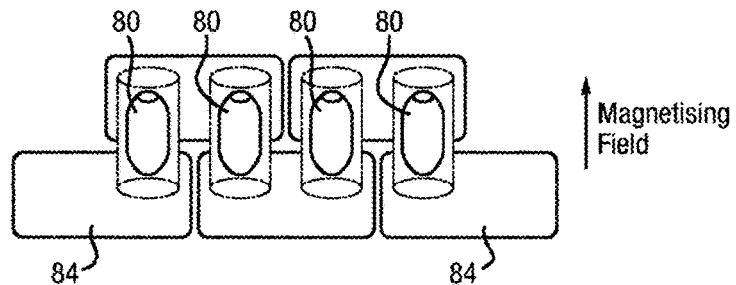
Figure 9A:
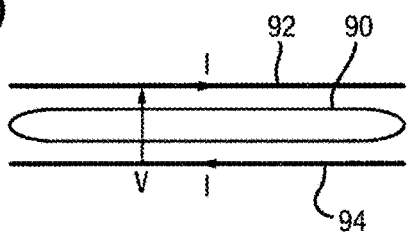
Figure 9B:
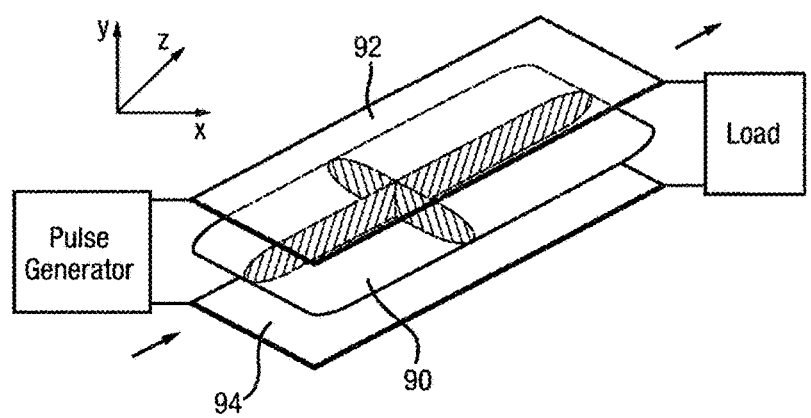
Figure 10A:
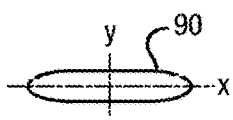
Figure 10B:
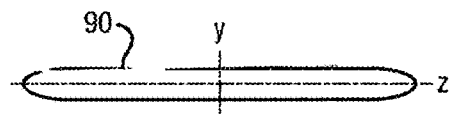

FIG. 4(a) to (f) are schematic views of a conventional plain ended cylinder, and then various shaped profiles in accordance with the invention modified from a flat end profile for at least reducing demagnetisation of the cylinder;

FIG. 5 is a schematic diagram showing a first embodiment of an MFO according to the invention;

FIG. 6 is a schematic diagram of a second embodiment of an MFO according to the invention;

FIG. 7 is a schematic view of a third embodiment in accordance with the invention;

FIG. 8 is a schematic view of a fourth embodiment in accordance with this invention;

FIGS. 9 (a) and (b) are schematic side and perspective views of a fifth embodiment in accordance with this invention, and FIGS. 10 (a) and (b) are respective sectional views of the magnetic element used in the fifth embodiment, taken parallel to the longitudinal axis and transverse to the longitudinal axis, respectively.

Figure 10C:
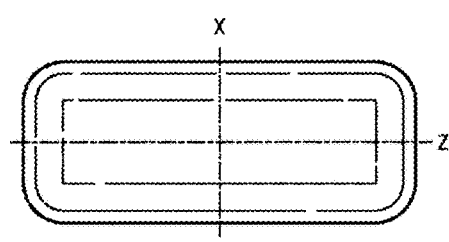

FIG. 10(c) is a plan view of the magnetic element used in the fifth embodiment.

Figure 1:
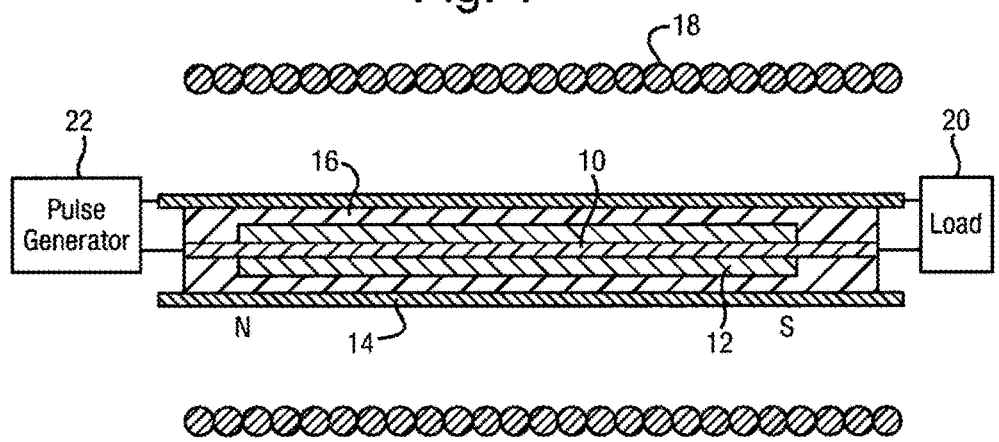
FIG. 1 is a cross section through an example of a prior art MFO structure.

Referring initially to FIG. 1, an existing form of MFO comprises a non-linear transmission line made up of a centre conductor 10 which passes through a hollow cylindrical magnetic element 12 of suitable material such as YIG. An outer conductor 14 of cylindrical form is disposed concentrically around the magnetic element 12 and the centre conductor 10. An insulating material or dielectric 16 is disposed between the magnetic element and the outer conductor. Concentrically surrounding the outer conductor 14 is a solenoidal coil 18. The magnetic element 12 is made of a material that is selected to provide suitable gyromagnetic characteristics.

A load 20 is connected across the centre and outer conductors 10, 14, and the device is energised in a known fashion using a high power video pulse generator 22.

In operation, the solenoidal coil 18 applies a static axial bias to the magnetic material to align the magnetisation vector of the material of the magnetic element 12 along a particular axis, typically the axial direction of the transmission line. The pumping impulse provided by the pulse generator 22 produces a circumferential magnetic field that rotates the magnetisation vector of the magnetic material away from its bias direction towards the circumferential direction. The rate at which the magnetisation vector is rotated depends on the rise time of the pumping impulse and also the amplitude of the pumping impulse in combination with geometric factors and the saturation magnetisation of the ferrite. A sufficiently short rise time to the pumping impulse causes the magnetisation vector in the magnetic material to gyromagnetically precess about the direction of the net applied magnetic field. Precession of the magnetisation vector produces an oscillatory magnetic field component in the transmission line. This precessing field component couples with the field of the pumping impulse to produce a modulation of the amplitude of the pumping impulse. The length of the non-linear transmission line required for the modulated signal to build up to its steady state amplitude is typically 5-50 cm. The duration of the microwave modulation that can be developed is typically in the region of 1-10 ns for a single impulse.

Figure 2:
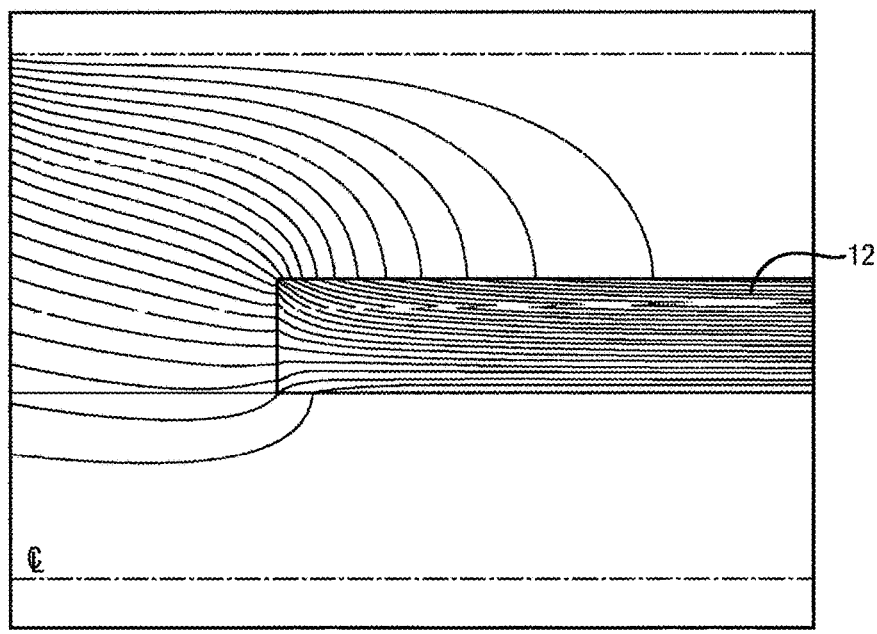
FIG. 2 is an enlarged sectional view through the radius of an end region of another prior art hollow cylindrical bead terminating in a flat square end, showing the spreading of flux lines and non-uniformity of the magnetic field.

Referring to FIG. 2, this illustrates the partial demagnetisation that is experienced due to the plane end of the hollow cylindrical element. The spreading of the flat lines indicates that the flux density at the end face is approximately halved relative to the uniform region.

Figure 3:
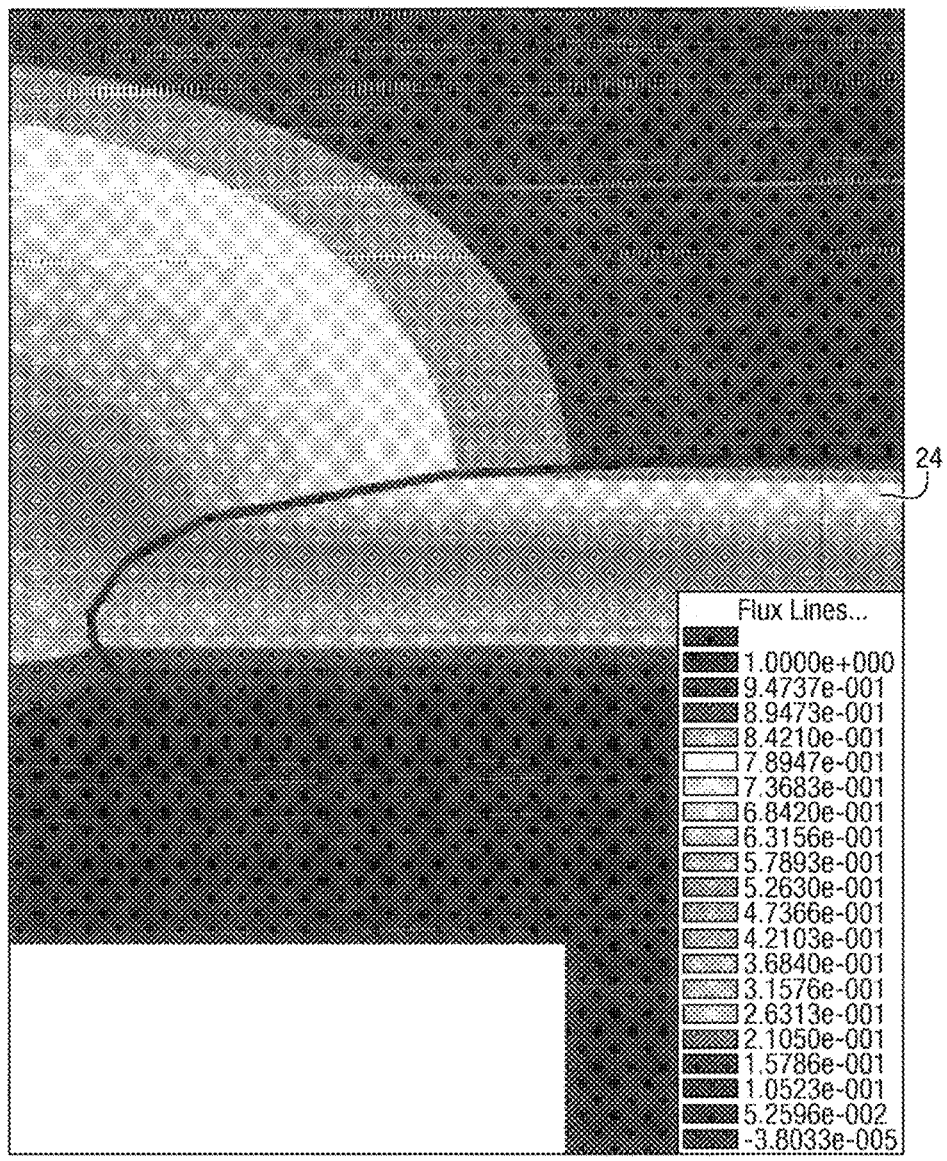
FIG. 3 is a view similar to FIG. 1 but showing the flux lines through the end region of a magnetic element with a tapered shape, in accordance with this invention, showing substantially parallel flux lines internal to the magnetic element, indicative of the substantially uniform magnetisation.
Figure 4A:
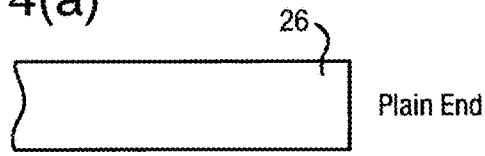
Figure 4B:
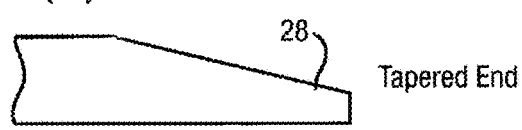
Figure 4C:
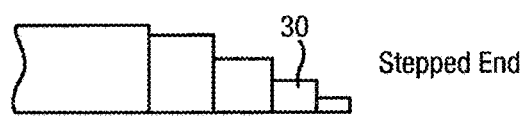
Figure 4D:
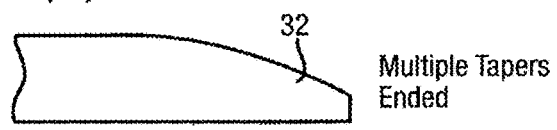
Figure 4E:
Figure 4F:

In the embodiments of this invention, the annular end region of the magnetic cylindrical element is changed in profile so as to cause the magnetic flux lines within the material to remain substantially parallel all the way to the outer surface. FIG. 3 shows a worked example of a ferrite bead 24 of 49 mm outer diameter and 32 mm internal diameter with a shaped end showing the parallel flux lines obtained within the material as a result of the profiling.

Referring now to FIG. 4, there is shown the conventional plane end 26 and a number of profiles 28 to 36 that are modified from the plane end in order to provide more uniform magnetisation of the magnetic element. In each case, the end region of the magnetic element is a solid of revolution of the profile shown with the resultant cylindrical end having a taper on at least the radially outer surface thereof. Thus in FIG. 4(b) the cylindrical part 28 includes a radially outer linear taper terminating in a flat end. The tapered portion serves to reduce the divergence or spread of the flux lines seen in FIG. 2. In FIG. 4(c) the cylindrical part 30 has a stepped taper which may be machined from a monolithic cylinder or it may be fabricated, for example by assembling a stack of rings of reducing outer diameter on a plain cylinder. Alternatively the same effect could be achieved by providing a series of overlapping sleeves of progressively differing length. Referring to FIG. 4(d), instead of providing a single taper, the cylindrical part 32 has a series of two or more tapered sections. These may be blended together to provide a polygonal profile to approximate a curve. In FIG. 4(e) there is shown a section similar to that of FIG. 4(d) except the cylindrical part 34 has a taper or flare on the inner surface as well as on the outer surface. Finally, in FIG. 4(f) the cylindrical part 36 has a full ellipsoid-like curve.

Referring now to FIGS. 5 to 10, the shaped ferrimagnetic or ferro-magnetic elements may be used in a wide range of different architectures of MFO. As noted above, the magnetic element may be made of any suitable material that exhibits gyromagnetic properties, for example:
  Garnet-structured ferrite, e.g. yttrium iron garnet
  Spinel type ferrite e.g. nickel zinc, lithium zinc
  Micro- or Nano-structured materials, e.g. Fe, Co, permalloy.

For brevity, the term ferrite will be used in the following to refer to the shaped gyromagnetic element as this in practice is the material in most general use; although in principle it may be any suitable material including those listed above. In FIG. 5, a coaxial transmission line is made up of a pulse generator 50, which supplies a video pulse to an arrangement similar to that of FIG. 1, although in this arrangement the hollow cylindrical element 52 of ferrite is provided at its output end with a shaped end profile selected from those set out in FIG. 4(b) to (f). Here the hollow cylindrical element 52 is used in a continuous (dispersionless) coaxial transmission line connected to a load 54. The output end is profiled to make the static magnetisation uniform in the axial direction. The input end is not profiled for economic reasons. The hollow cylindrical element 52 is spaced from the centre conductor 56 by a dielectric material 58, and provided with an axial bias by suitable means, as before.

Referring now to FIG. 6, this embodiment is similar to that shown in FIG. 5 except here the hollow cylindrical element 60 of ferrite is shaped equally at each end. This allows the radio frequency signal to be extracted from either end of the device, for example if there is a mismatch at the output end or if the device is designed to allow for bi-directional operation. Profiling the ferrite at both ends has a further advantage that, because the magnetisation is fully aligned all along the MFO, including at the input, there will generally be a reduction in timing jitter between pulse input and pulse output. This is very advantageous for very low jitter systems (as low as 10 picoseconds or better).

Referring to FIG. 7, in this embodiment, a number of short ferrite magnetic elements or beads 70 are built into a discrete NLTL line with the number of sections typically in the range of 20 to 200. Each ferrite bead is profiled to enable individually uniform axial biasing which enhances the NLTL modulation process. If the cylindrical bead 70 were flat-ended it would generally be difficult to fully magnetise the ferrite due to the end effects, and a significant fraction would remain in 'reversal mode' which is slow and gives less efficient RF conversion. This effect is at least reduced by shaping of the ferrite beads to have profiled ends as set out above. In this arrangement the ferrites are disposed on a centre conductor 72 but interposed by capacitor regions 74.

In the embodiment shown in FIG. 8 a series of beads 80 is arranged with the beads parallel, each magnetised by an external coil or magnet arrangement (not shown), and conductors passing through each bead to connect to pads 84 either side.

In each of the above embodiments, the ferrite is in the form of a hollow cylindrical element with one or both ends suitably profiled. In the fifth embodiment illustrated in FIGS. 9 and 10, the magnetic element 90 is arranged as a slab of ferrite material between two parallel plates 92, 84. The ferrite material is solid and profiled to taper at opposite extremities in the axial (Z) and the lateral (X) directions so as to reduce or prevent spread or divergence of the magnetic flux lines in the body of the material. In this embodiment, the input pulse is applied across one end of the parallel plates 92, 94, with the output being taken from the other end. In this arrangement a static magnetic bias field is applied parallel to the length of the slab (the Z direction) by means of a solenoidal coil or a permanent magnet arrangement. By profiling the magnetic element in two dimensions any transient as well as static demagnetisation effects are minimised in the X and Z directions remaining only in the desirable/advantageous vertical Y direction. The ability to use slabs of material may be advantageous as these may be far easier to produce than cylindrical coaxial structures and could pave the way both to lower impedance and higher power devices than those currently feasible, also to thin or thick film devices at much smaller power and volume scales than currently feasible. In this arrangement, the magnetic element may also be segmented for ease of manufacture or to enable a periodic magnetisation structure.

In a sixth embodiment, the MFO is arranged with a short circuit termination at the end further from the pulse input. The purpose of this structure is to reflect the pulse back along the line. This will give rise to a higher frequency than is achieved in the usual arrangement of FIG. 5, but without requiring higher voltage, because higher net current and net magnetic field are obtained by the superposition of two travelling waves of opposite polarity, and the frequency increases with increased net field. Again, there is benefit in having the shaped end profile at both ends of the line, as this minimises losses and dissipation, both when the forward going pulse reaches the short circuit and also when the RF exits the ferrite line at the input end. This could be achieved using any of the embodiments shown in FIGS. 6 to 10, with a suitable short circuit termination at the end further from the pulse input.

In the above arrangements the power extracted from the device may be improved to allow maximisation of RF amplitude to, at or near optimal levels from gyromagnetic devices such as MFO, NLTL for practicable diameters of a few mm and upwards corresponding to power levels of 1 MW-1 GW or above. The above devices also reduce unnecessary attenuation of the RF signal within the MFO device. These improvements may be significant with prospective high saturation materials such as NiZn, and LiZn. Furthermore, it may be feasible to combine the magnetic shaping described herein with improved impedance matching and powerflow across the end boundaries. Because the embodiments of the invention can be used to improve or maximise the efficiency of the modulator (ie to maximise power output/power input ratio), this should minimise weight and volume of any MFO based system required to produce a specific output field and power. This can specifically be achieved by minimising:

the number of MFO elements,
the size of individual MFOs,
the rating of pulse generator or generators to drive MFOs,
the size of primary power supply,
the size of primary energy store e.g. battery, ultracapacitor.

The techniques and devices disclosed herein may be used for a wide variety of applications, including ground penetrating radar, e.g. for counter-IED detection, the in-band attack of sensor systems, electronics defeat applications, further directed energy applications, and experiments in electromagnetic shock physics.

The invention claimed is:

1. A microwave frequency oscillator for producing an RF signal, said microwave frequency oscillator comprising:
a non-linear transmission line containing at least one element of magnetic material having in use a magnetic bias field along a given axis;
an input for applying an input signal to the transmission line for being modulated thereby; and
an output for the modulated signal;
wherein said magnetic element has opposed end regions spaced along said axis, and at least one of said end regions is profiled to at least reduce demagnetisation of said material in said end region;
wherein said magnetic material exhibits gyromagnetic properties, such that the input signal is modulated as a result of gyromagnetic precession effect, and wherein said magnetic material contains one or more of the following: garnet-structured ferrite and spinel type ferrite; and
wherein a wall thickness of the magnetic element decreases towards an end thereof.

2. The microwave frequency oscillator according to claim 1, wherein both said end regions are profiled to reduce demagnetisation in said end region.

3. The microwave frequency oscillator according to claim 1, wherein the magnetic element is of hollow cylindrical form, and at least one end region thereof is externally tapered.

4. The microwave frequency oscillator according to claim 3, wherein said external taper is defined by a straight line generatrix defining a frusto-conical surface.

5. The microwave frequency oscillator according to claim 3, wherein said external taper is defined by a plurality of stepped regions.

6. The microwave frequency oscillator according to claim 3, wherein said external taper includes two or more taper regions of different taper angle.

7. The microwave frequency oscillator according to claim 3, wherein an inner wall of said cylinder tapers outwardly towards the free end.

8. The microwave frequency oscillator according to claim 7, wherein said external taper is generally curved or ellipsoidal in section.

9. The microwave frequency oscillator according to claim 3, wherein said magnetic element is made up of an assembly of concentric sleeves.

10. The microwave frequency oscillator according to claim 3, which further comprises a coaxial electrical conductor arrangement, with a first electrically conducting element passing through a hollow part of the magnetic element, and a concentric conductor element surrounding and spaced from said magnetic element, the coaxial conductor arrangement being adapted in use to receive an input pulse at one end from a pulse generator and to deliver an output signal at another end, wherein the end of the magnetic element proximate said output end is externally tapered.

11. The microwave frequency oscillator according to claim 1, wherein said magnetic element is of elongate generally rectilinear solid form and having first and second opposed end regions transverse to the longitudinal axis, said magnetic bias arrangement being configured to apply a bias field extending generally longitudinally, and wherein the magnetic element tapers in thickness towards at least one of said end regions, thereby to provide a tapered longitudinal cross section.

12. The microwave frequency oscillator according to claim 11, wherein a height of the magnetic element is less than a width of the magnetic element, and the height of the magnetic element reduces towards the sides thereby to provide a tapered transverse cross section.

13. A microwave frequency oscillator for producing an RF signal, said microwave frequency oscillator comprising:
a non-linear transmission line containing at least one element of magnetic material having in use a magnetic bias field along a given axis;
an input for applying an input signal to the transmission line for being modulated thereby; and
an output for the modulated signal;
wherein said magnetic element has opposed end regions spaced along said axis, and at least one of said end regions is profiled to at least reduce demagnetisation of said material in said end region;

wherein said magnetic material exhibits gyromagnetic properties, such that the input signal is modulated as a result of gyromagnetic precession effect, and wherein said magnetic material contains one or more of the following: garnet-structured ferrite and spinel type ferrite;

wherein said magnetic element is of elongate generally rectilinear solid form and having first and second opposed end regions transverse to the longitudinal axis, said magnetic bias arrangement being configured to apply a bias field extending generally longitudinally, and wherein the magnetic element tapers in thickness towards at least one of said end regions, thereby to provide a tapered longitudinal cross section; and wherein said magnetic element has a height, width, and length, and the height and width are each less than 10% of the length.

14. The microwave frequency oscillator according to claim 11, including a plurality of solid magnetic elements.

15. The microwave frequency oscillator according to claim 11, wherein said magnetic element is of flat rectilinear form disposed between two generally parallel conductor plates to which said excitation pulse is applied and from which the modulated output is taken.

16. A microwave frequency oscillator for producing an RF signal, said microwave frequency oscillator comprising:

a non-linear transmission line containing at least one element of magnetic material having in use a magnetic bias field along a given axis, wherein:

said magnetic element has opposed end regions spaced along said axis, and at least one of said end regions is profiled to at least reduce demagnetisation of said material in said end region;

said magnetic element is of hollow cylindrical form, and at least one end region thereof is externally tapered, with a wall thickness of the magnetic element decreasing towards a free end thereof; and said magnetic element has a height, a width, and a length, and the height and the width are each less than 10% of the length;

an input for applying an input signal to the transmission line for being modulated thereby;

an output for the modulated signal; and a coaxial electrical conductor arrangement, with a first electrically conducting element passing through the hollow part of the magnetic element, and a concentric conductor element surrounding and spaced from said magnetic element, the coaxial conductor arrangement being adapted in use to receive an input pulse at one end and to deliver an output signal at another end, wherein the end of the magnetic element proximate said output end is externally tapered.

17. A microwave frequency oscillator according to claim 16, wherein the magnetic element contains one or more of the following: garnet-structured ferrite, spinel type ferrite, micro-structured materials, and nano-structured materials.

18. The microwave frequency oscillator according to claim 1, wherein said magnetic material contains garnet-structured ferrite that comprises yttrium iron garnet.

19. The microwave frequency oscillator according to claim 1, wherein said magnetic material contains spinel type ferrite that comprises nickel zinc or lithium zinc.

20. The microwave frequency oscillator according to claim 1, wherein said magnetic element is of hollow cylindrical form and comprised of an assembly of successive varying ellipsoid sections to provide substantially uniform magnetisation of the magnetic element.

21. The microwave frequency oscillator according to claim 1, wherein said magnetic element is of hollow cylindrical form, and wherein both said end regions are profiled to reduce demagnetisation of said magnetic material in both said end regions.

* * * * *